(12) United States Patent
Koma et al.

(10) Patent No.: US 8,220,943 B2
(45) Date of Patent: Jul. 17, 2012

(54) ILLUMINATION DEVICE AND DISPLAY APPARATUS

(75) Inventors: Norio Koma, Gifu (JP); Kenji Tanase, Mizuho (JP); Yasushi Karasawa, Shiojiri (JP); Tadayoshi Ikehara, Suwa (JP)

(73) Assignee: Seiko Epson Corporation (JP)

( * ) Notice: Subject to any disclaimer, the term of this patent is extended or adjusted under 35 U.S.C. 154(b) by 321 days.

(21) Appl. No.: 12/716,494

(22) Filed: Mar. 3, 2010

(65) Prior Publication Data

US 2010/0226120 A1 Sep. 9, 2010

(30) Foreign Application Priority Data

Mar. 5, 2009 (JP) .................. 2009-051618

(51) Int. Cl.
*G09F 13/04* (2006.01)
(52) U.S. Cl. .................. 362/97.1; 362/249.02
(58) Field of Classification Search .................. 362/97.1, 362/97.2, 97.3, 249.02
See application file for complete search history.

(56) References Cited

U.S. PATENT DOCUMENTS

| 7,708,451 B2 * | 5/2010 | Jang et al. ................ 362/249.02 |
| 2006/0132671 A1 | 6/2006 | Koma |
| 2006/0261337 A1 | 11/2006 | Koma |
| 2009/0102989 A1 * | 4/2009 | Sakai et al. ................ 362/97.1 |
| 2010/0085511 A1 * | 4/2010 | Watanabe et al. ............ 362/97.1 |

FOREIGN PATENT DOCUMENTS

| JP | 60-221791 | 11/1985 |
| JP | 02-204995 | 8/1990 |
| JP | 2005-191010 | 7/2005 |
| JP | 2006-154402 | 6/2006 |
| JP | 2006-234963 | 9/2006 |
| JP | 2006-323302 | 11/2006 |
| JP | 2006-323305 | 11/2006 |
| JP | 2006-350303 | 12/2006 |
| JP | 2007-041536 | 2/2007 |
| JP | 2008-077864 | 4/2008 |

* cited by examiner

*Primary Examiner* — David V Bruce

(74) *Attorney, Agent, or Firm* — Harness, Dickey & Pierce, P.L.C.

(57) ABSTRACT

An illumination device includes: a substrate; a first transparent electrode covering approximately an entire surface of a display region of the substrate; a second transparent electrode which overlaps with the first transparent electrode when seen in plan view and covers approximately the entire surface of the display region; and a plurality of island shaped light emitting elements disposed between the first transparent electrode and the second transparent electrode. The first and second transparent electrodes are formed as single continuous films.

12 Claims, 3 Drawing Sheets

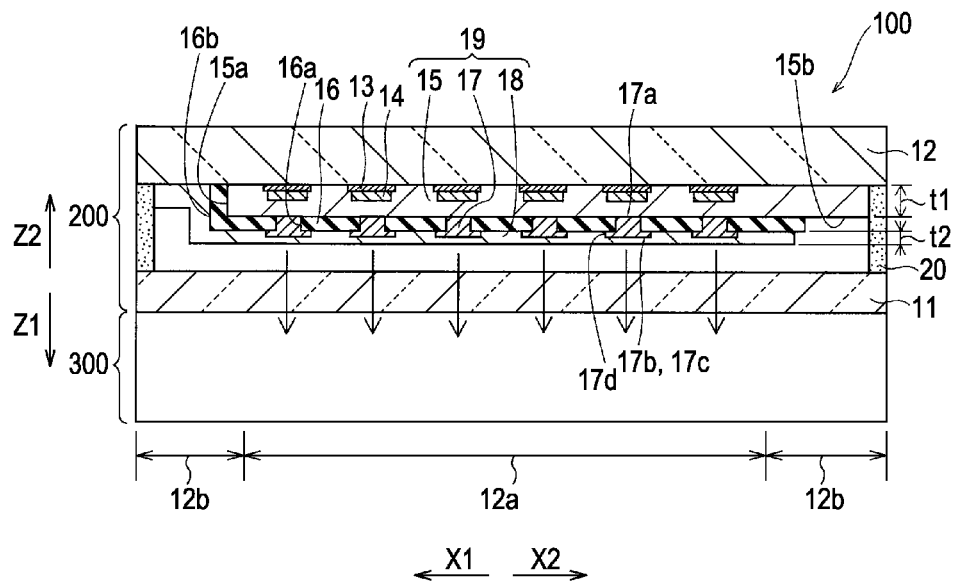
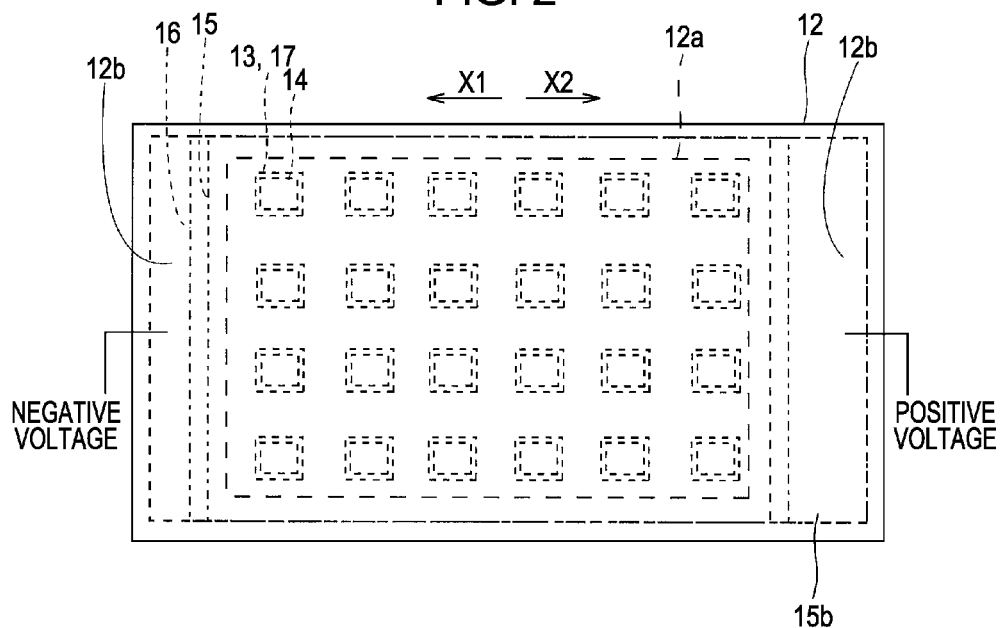

ILLUMINATION DEVICE AND DISPLAY APPARATUS

This application claims priority to Japanese Patent Application No. 2009-051618 filed Mar. 5, 2009 which is hereby expressly incorporated by reference herein in its entirety.

BACKGROUND

1. Technical Field

The present invention relates to an illumination device and a display apparatus, and more particularly, to an illumination device and a display apparatus which include a pair of electrodes and light emitting elements.

2. Related Art

In the related art, an illumination device including a pair of electrodes and light emitting elements is known (for example, see JP-A-2008-77864). The illumination device disclosed in JP-A-2008-77864 includes a positive electrode which is formed of a pectinate transparent electrode having a single body and a plurality of line shaped arms, and a negative electrode which is formed of a pectinate transparent electrode having a single body which is disposed to intersect with the pectinate positive electrode and a plurality of line shaped arms. Light emitting elements (organic electroluminescence elements) are provided between the arms of the positive electrode and the arms of the negative electrode in a location where the arms of the positive electrode intersect the arms of the negative electrode.

However, in the illumination device disclosed in the JP-A-2008-77864, since the arms of the positive electrode and the arms of the negative electrode are formed to have line shapes, respectively, the electrical resistance of the positive electrode and the negative electrode becomes high.

SUMMARY

One advantage of the embodiments of the invention is that an illumination device and a display apparatus are provided that are capable of preventing an increase of the electrical resistance of electrodes.

According to a first aspect, there is provided an illumination device including: a substrate; a first single film transparent electrode which covers approximately an entire surface of a display region of the substrate; a second single film transparent electrode which overlaps with the first single film transparent electrode when seen in plan view and covers approximately the entire surface of the display region; and a plurality of island shaped light emitting elements disposed between the first and second single film transparent electrodes. Herein, the term "single film" means a continuous and solid layer devoid of any holes passing therethrough.

In the illumination device according to the first aspect, as described above, the first and second transparent electrodes are formed as single films which cover approximately the entire surface of the display region. Accordingly, the electrical resistance of the first and second transparent electrodes may be prevented from increasing since the first and second transparent electrodes are formed as single films in contrast to a plurality of line shaped electrodes.

Further, since the first and second transparent electrodes are formed as single films covering approximately the entire surface of the display region, for example, it is possible to prevent moiré (a periodical interference pattern) which may be generated if the first and second transparent electrodes are formed as a plurality of line shaped electrodes. In addition, since the first and second transparent electrodes are formed as single films covering approximately the entire surface of the display region, it is not necessary to process the first and second transparent electrodes with a fine pattern, and thus, the first and second transparent electrodes may be easily formed. Moreover, since the first and second transparent electrodes are formed as single films covering approximately the entire surface of the display region, electrode patterns may be prevented from being exposed (visualization) which may occur if the first and second transparent electrodes are formed as a plurality of line shaped electrodes.

In the illumination device according to the first aspect, it is preferable that the first and second transparent electrodes have an approximately rectangular shape. The first transparent electrode has a first portion protruding from the second transparent electrode on one side of the second transparent electrode when seen in plan view. The second transparent electrode has a second portion protruding from the first electrode on another side opposite the one side. One of a positive voltage and a negative voltage is supplied to the first portion of the first transparent electrode. The other of the positive and negative voltage is supplied to the second portion of the second transparent electrode. Since the first portion of the first transparent electrode (the protruded portion) is a continuous and uninterrupted layer, the electrical resistance of the first transparent electrode may be prevented from increasing as compared with the case that the protruded portion of the first transparent electrode is formed of a plurality of line shaped electrodes and one of the positive voltage and the negative voltage is supplied to the plurality of line shaped electrodes.

In the illumination device according to the first aspect, it is preferable to further include an insulation film between the first transparent electrode and the second transparent electrode. The light emitting elements are formed to be in direct contact with the first and second transparent electrodes via openings formed in the insulation film. With such a configuration, since the illumination device may be easily embodied with a simple configuration, it is possible to simplify the manufacturing process and to reduce costs.

In this case, it is preferable that the light emitting elements are formed to be in direct contact with one of the first transparent electrode and the second transparent electrode, and island shaped electrodes are formed between the other of the first and second transparent electrodes and the light emitting elements. With such a configuration, since the electrode on one side of the light emitting elements serves as the first transparent electrode and the other electrode thereof serves as the island shaped electrodes formed between the light emitting elements and the second transparent electrode, the light emitting efficiency of the light emitting elements may be increased.

In the illumination device in which the insulation film is formed between the first and second transparent electrode, it is preferable that the insulation film is disposed between the first and second transparent electrodes in a position where the first transparent electrode overlaps with the second transparent electrode when seen in plan view, and is also arranged between the first and second transparent electrodes in a position where a side surface of the first transparent electrode is opposite to the second transparent electrode. With such a configuration, the first transparent electrode is insulated from the second transparent electrode, thereby positively preventing an electrical short.

In the illumination device according to the first aspect, it is preferable to further include a light shielding film and a reflective film that overlap with the light emitting elements when seen in plan view. The light shielding film is formed to be in direct contact with the surface of the substrate, and the reflective film is formed on a surface of a side of the light shielding film which is opposite to the light emitting elements. With such a configuration, the light shielding film is formed to be in direct contact with the surface of the substrate, and thus, a photolithography process may be used and the light shielding film may be easily patterned with a desired size, thereby preventing a decrease of an aperture ratio (a region into which light transmits) which may be generated in the case that the light shielding film is formed with a size larger than the desired size. Moreover, the light shielding film is formed to overlap with the light emitting element when seen in plan view. Accordingly, in a top emission type light emitting element in which light is emitted from the light emitting element toward the second transparent electrode (in a direction opposite to the light shielding film), the light may be prevented from being leaked, by the light shielding film, in a direction which is opposite to the direction in which the light is emitted from the light emitting element.

In the illumination device according to the first aspect, it is preferable to further include a light shielding film and a reflective film which overlap with each of the light emitting elements when seen in plan view. The reflective film is formed on the surface of the second transparent electrode, and the light shielding film is formed on the surface of the reflective film. With such a configuration, in a bottom emission type light emitting element in which light is emitted from the light emitting element toward the first transparent electrode (in the direction opposite to the light shielding film), the light may be prevented from being leaked, by the light shielding film, in the direction which is opposite to the direction in which the light is emitted from the light emitting element.

According to a second aspect, there is provided a display apparatus including an illumination device having any one of the above described configurations. With such a configuration, since the illumination device may illuminate a reflective display panel or a semi-transmissive display panel from an observer side, moiré which may be generated by interference between patterns of the display panel and patterns of the illumination device may be prevented. In addition, it is possible to obtain a display apparatus in which the electrical resistance of the electrodes of the illumination device may be prevented from being increased.

BRIEF DESCRIPTION OF THE DRAWINGS

Embodiments of the invention will be described with reference to the accompanying drawings, wherein like numbers reference like elements.

FIG. 1 is a sectional view illustrating an illumination device according to a first embodiment.

FIG. 2 is a plan view illustrating the illumination device according to the first embodiment.

DESCRIPTION OF EXEMPLARY EMBODIMENTS

Figure 3:
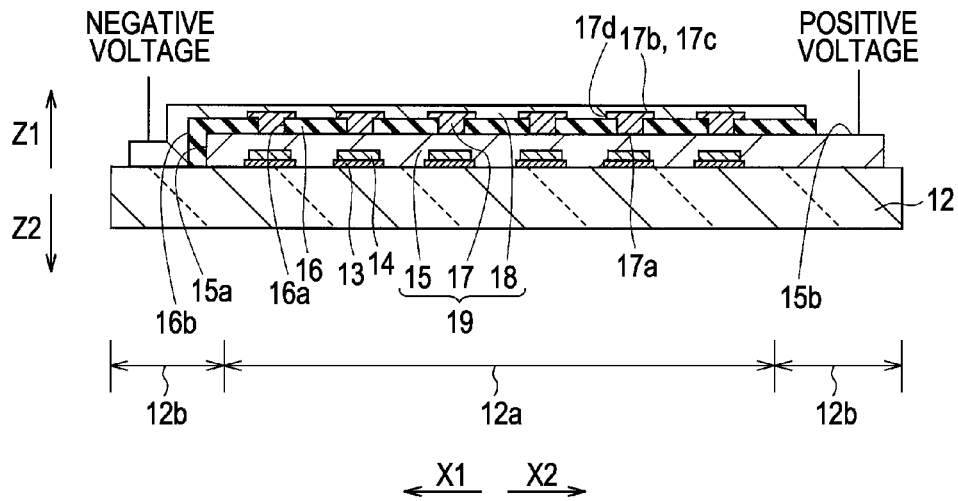
FIG. 3 is a sectional view illustrating the illumination device according to the first embodiment.

Hereinafter, a preferred embodiment will be described with reference to the accompanying drawings.
First Embodiment A configuration of a display apparatus 100 according to a first embodiment will be described with reference to FIGS. 1 to 3.

As shown in FIG. 1, the display apparatus 100 according to the first embodiment includes an illumination device 200 and a reflective liquid crystal display apparatus 300.

As shown in FIG. 1, the illumination device 200 includes a substrate 11 which is made of a transparent member such as glass, and a substrate 12 which is made of a transparent member such as glass and is disposed opposite to the substrate 11. In the first embodiment, a light shielding film 13 which is made of, for example, chromium (Cr), chromium oxide ($CrO_2$), or the like is formed on a surface of the substrate 12 which faces the reflective liquid crystal display apparatus 300 (in the direction Z1). The light shielding film 13 prevents light emitted from a light emitting element 17, described later, from leaking in the direction Z2. The light shielding film 13 is formed directly on the surface of the substrate 12 by forming a film made of chromium (Cr), chromium oxide ($CrO_2$), or the like on the surface of the substrate 12 and then patterning the film. As shown in FIG. 2, the light shielding film 13 is formed to have an approximately rectangular shape and is provided as a plurality of members. Moreover, the light shielding films 13 are arranged as islands in a matrix shape on the surface of the substrate 12. As shown in FIG. 2, the light shielding films 13 are provided to overlap with the light emitting elements 17.

In the first embodiment, as shown in FIG. 1, a reflective film 14 made of metal such as Al is formed on the surface of each of the plurality of light shielding films 13 and faces the reflective liquid crystal display apparatus 300 (in the direction Z1). As shown in FIG. 2, the reflective film 14 is formed to have an approximately rectangular shape. Further, light emitted from the light emitting elements 17, described later, that is leaked in the direction Z2 is reflected by the reflective film 14 in the direction Z1. As shown in FIG. 2, the reflective film 14 is formed to overlap with the light emitting elements 17 in plan view. The light shielding film 13 is formed to be larger than the reflective film 14 when seen in plan view and is arranged to protrude from the reflective film 14.

In the first embodiment as shown in FIG. 1, a positive electrode 15 in the form of a transparent electrode such as ITO (Indium Tin Oxide), IZO (Indium Zinc Oxide) or $SnO_2$ (tin oxide) is provided to cover the surface of the substrate 12, the light shielding film 13 and the reflective film 14, and has an approximately rectangular shape comprising a single, solid and continuous film (a layer without any openings passing therethrough). The positive electrode 15 is an example of a first transparent electrode. In addition, the positive electrode 15 has a thickness t1 of approximately 30 nm or more to 200 nm or less.

In the first embodiment, as shown in FIG. 2, the positive electrode 15 covers approximately the entire surface of a display region 12a (a region in which an image is displayed) of the substrate 12, and a non-display region 12b disposed in a direction X2 with reference to the display region 12a, when seen in plan view. Moreover, the positive electrode 15 is formed to have an approximately rectangular shape to cover the plurality of light shielding films 13 (and reflective films 14) which are arranged in a matrix shape, when seen in plan view.

As shown in FIG. 1, an insulation film 16 which is made of, for example, a silicon dioxide ($SiO_2$) film or a silicon nitride (SiN) film is formed on a surface of the positive electrode 15. In the first embodiment, the insulation film 16 is disposed between the positive electrode 15 and a negative electrode 18, described later, in a location where the positive electrode 15 overlaps with the negative electrode 18. Further, the insulation film 16 extends between the positive electrode 15 and the negative electrode 18 in a position where a side surface 15a of the positive electrode 15 in the direction X1 is opposite to the negative electrode 18.

In addition, in the first embodiment, a plurality of contact holes 16a is formed on the insulation film 16. The light emitting elements 17 made of an organic layer are formed in the contact holes 16a of the insulation film 16 so as to be in direct contact with the positive electrode 15 and the negative electrode 18, described later. The contact holes 16a are an example of openings. The light emitting elements 17 are formed of an electron transport layer, a light emitting layer and a hole transport layer. Moreover, in the first embodiment, approximately an entire surface of one end 17a of each light emitting element 17 (the surface of each light emitting element 17 in the direction Z2) is formed to be in direct contact with the positive electrode 15, and approximately an entire surface of the other end 17b of each light emitting element 17 (the surface of each light emitting element 17 in the direction Z1) is formed to be in direct contact with the negative electrode 18.

The negative electrode 18 which is formed as a transparent electrode such as ITO, IZO or $SnO_2$ and has an approximately rectangular shape comprising a single, solid and continuous film without any openings passing therethrough is formed on a surface of the insulation film in the direction Z1, and on a surface of the light emitting elements 17 in the direction Z1. The negative electrode 18 is an example of a second transparent electrode. The negative electrode 18 has a thickness t2 of approximately 30 nm or more to 200 nm or less. As shown in FIG. 3, a portion of the negative electrode 18 in the direction X1 covers a side surface 16b of the insulation film 16 in the direction X1 and covers the surface of the substrate 12. In the first embodiment, the negative electrode 18 is formed to overlap with the positive electrode 15 and covers approximately the entire surface of the display region 12a when seen in plan view, and the non-display region 12b disposed in the direction X1 with reference to the display region 12a.

In the case that the positive electrode 15 or the negative electrode 18 is formed of a semi-transmissive metal such as an aluminum layer (Al layer), a magnesium silver layer (MgAg layer), a silver layer (Ag layer) or a gold layer (Au layer), it is desirable to form the semi-transmissive metal as a thin film of 20 nm or less so as to acquire light transmission. In the case that the semi-transmissive metal is formed with a stepped portion, the semi-transmissive metal may undesirably be cut in the stepped portion, but since the positive electrode 15 and the negative electrode 18 are formed with a thickness of approximately 30 nm or more to 200 nm or less, the cutting of the positive electrode 15 and the negative electrode 18 in any stepped portion can be prevented.

In the first embodiment, as shown in FIGS. 1 to 3, the positive electrode 15 includes a portion 15b which protrudes (is exposed) from the negative electrode 18 when seen in plan view. The portion 15b of the positive electrode 15 which protrudes from the negative electrode 18 is continuous and uninterrupted and therefore covers approximately an entire surface of a region (the non-display region 12b in the direction X2) where the positive electrode 15 protrudes from the negative electrode 18. That is, the portion 15b of the positive electrode 15 has a solid film shape without any openings (unlike line shaped electrodes). In addition, a positive voltage is supplied to the portion 15b of the positive electrode 15 which protrudes from the negative electrode 18. Moreover, a negative voltage is supplied to a region of the negative electrode 18 which is disposed opposite to the portion 15b of the positive electrode 15 (in the direction X1).

The positive voltage and the negative voltage are applied to the positive electrode 15 and the negative electrode 18, respectively, and thus, light is emitted from the light emitting elements 17 in the direction Z1. That is, a top emission type organic electroluminescence element (an organic EL element) 19 is formed by the positive electrode 15, the light emitting elements 17 and the negative electrode 18.

As shown in FIG. 1, the substrate 11 and the substrate 12 are joined to each other by a sealing layer 20. As shown in FIG. 2, the sealing layer 20 is formed to surround the four edges of the substrate 11 and the substrate 12. Accordingly, the organic EL element 19 is enclosed in a space which is surrounded by the substrate 11, the substrate 12 and the sealing layer 20. The space surrounded by the substrate 11, the substrate 12 and the sealing layer 20 may be filled with nitrogen and may be filled with a member (such as resin) having approximately the same refractive index as the substrate 11.

Figure 4:
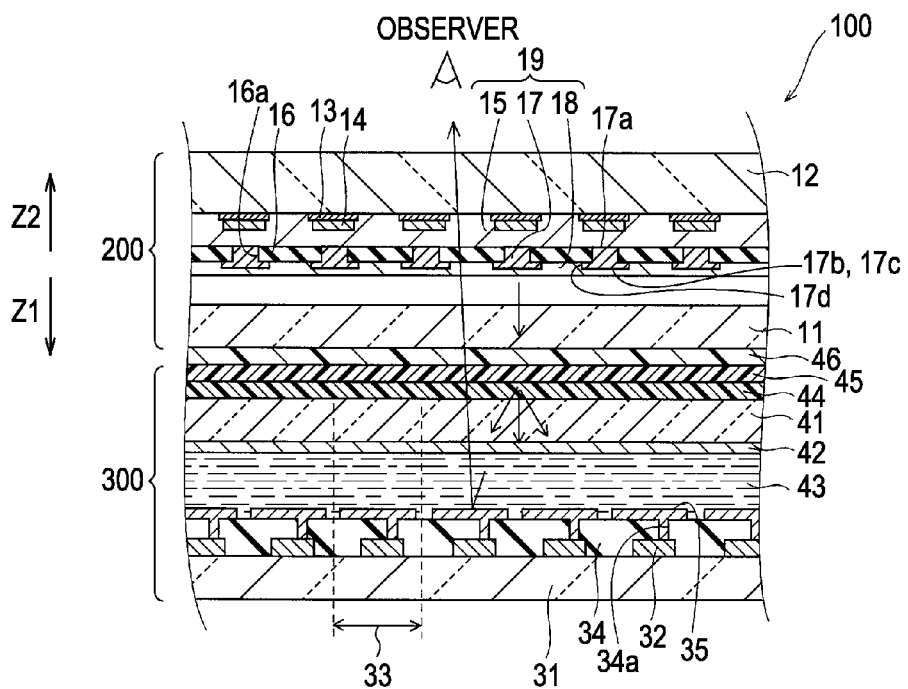
FIG. 4 is a sectional view illustrating a display apparatus according to the first embodiment.

As shown in FIG. 4, in the reflective liquid crystal display apparatus 300, a thin film transistor 32 for selecting pixels is formed on a surface of the substrate 31 made of glass. Further, a plurality of pixels 33 are provided in the reflective liquid crystal display apparatus 300. The thin film transistor 32 is formed for every pixel 33. The thin film transistor 32 is covered with an interlayer insulation film 34, and a pixel electrode 35 which is made of a reflective material such as aluminum (Al) is formed on a surface of the interlayer insulation film 34 so as to be connected to each thin film transistor 32. The pixel electrode 35 is connected to the thin film transistor 32 via a contact hole 34a which is formed in the interlayer insulation film 34.

A substrate 41 made of glass is arranged to be opposite to the substrate 31. A common electrode 42 which is formed of a transparent electrode such as ITO is formed on a surface of the substrate 41 toward the substrate 31 (in the direction Z1). The common electrode 42 covers the plurality of pixels 33. A liquid crystal layer 43 is enclosed between the pixel electrode 35 and the common electrode 42. In addition, a light scattering layer 44 including a diffusion cohesive layer, and a deflection plate 45 are sequentially stacked on the surface of the substrate 41 in the direction Z2. The light scattering layer 44 approximately uniformly scatters light emitted from the illumination device 200 to the reflective liquid crystal display apparatus 300.

The illumination device 200 and the reflective liquid crystal display apparatus 300 are joined to each other with a resin layer 46 interposed therebetween. The resin layer 46 is formed of, for example, an ultraviolet (UV) cured resin layer or a visible light cured resin layer having approximately the same refractive index as the substrate 11 made of glass. Accordingly, light may be prevented from being reflected in a boundary surface between the resin layer 46 and the substrate 11.

Next, an operation of the display apparatus 100 according to the first embodiment will be described with reference to FIG. 4.

First, a positive voltage is applied to the positive electrode 15, and simultaneously, a negative voltage is applied to the negative electrode 18. Accordingly, light is emitted from the light emitting elements 17 in the direction Z1. The light emitted from the light emitting elements 17 is deflected in a predetermined direction by the deflection plate 45 and scattered by the light scattering layer 44. The light scattered by the light scattering layer 44 passes through the substrate 41 made of glass and the common electrode 42 formed of the transparent electrode and then enters into the liquid crystal layer 43. The light entered into the liquid crystal layer 43 is reflected in the direction Z2 by the pixel electrode 35 made of a reflective material such as aluminum (Al). Further, the light reflected by the pixel electrode 35 passes through a reverse path with respect to a path along which the light enters into the reflective liquid crystal display apparatus 300, and then enters into the illumination device 200. The light entered into the illumination device 200 is observed by an observer through the substrate 11, the negative electrode 18 formed of the transparent electrode, the insulation film 16, the positive electrode 15 formed of the transparent electrode and the substrate 12. Accordingly, an image displayed on the reflective liquid crystal display device 300 is observed by the observer.

In the first embodiment, as described above, the positive electrode 15 and the negative electrode 18 are formed as single, continuous and solid films which cover approximately the entire surface of the display region 12a, and thus, the electrical resistance of the positive electrode 15 and the negative electrode 18 may be prevented from being increased in contrast to the case that would exist if the positive and negative electrodes were formed as a plurality of line shaped electrodes.

Moreover, in the first embodiment, since the positive electrode 15 and the negative electrode 18 are formed as single continuous films which cover approximately the entire surface of the display region 12a as described above, for example, it is possible to prevent moiré (the periodical interference pattern) generated by positive and negative electrodes which are formed as a plurality of line shaped electrodes. In addition, since the positive electrode 15 and the negative electrode 18 are formed of single continuous films which cover approximately the entire surface of the display region 12a, it is not necessary to process the positive electrode 15 and the negative electrode 18 with a fine pattern, and thus, the positive electrode 15 and the negative electrode 18 may be easily formed. Further, since the positive electrode 15 and the negative electrode are formed of single continuous films which cover approximately the entire surface of the display region 12a, the patterns of the electrodes may be prevented from being exposed (visualization) which is, for example, unlike the case that could occur if the positive and negative electrodes were formed as a plurality of line shaped electrodes.

Further, in the first embodiment, as described above, the light emitting elements 17 are arranged as islands in a matrix shape, and the light emitting elements 17 arranged in the matrix shape are arranged between the positive electrode 15 which covers approximately the entire surface of the display region 12a and the negative electrode 18 which covers approximately the entire surface of the display region 12a. Accordingly, since the light emitting elements 17 are electrically connected with the positive electrode 15 and the negative electrode 18 which are formed as single films, respectively, the electrical resistance of the positive electrode 15 and the negative electrode 18 may be prevented from being increased which is, for example, unlike the case that could occur if the light emitting elements arranged as islands in a matrix shape were electrically connected with a plurality of line shaped electrodes.

In the first embodiment, as described above, the positive electrode 15 has the portion 15b which protrudes from the negative electrode 18 when seen in plan view, and the portion 15b of the positive electrode 15 which protrudes from the negative electrode 18 covers approximately an entire surface of a region in which the positive electrode 15 protrudes from the negative electrode 18. Further, the positive voltage is supplied to the portion 15b of the positive electrode 15 which protrudes from the negative electrode 18, and the negative voltage is supplied to the region of the negative electrode 18 which is disposed opposite to the portion 15b of the positive electrode 15 which protrudes from the negative electrode 18. Accordingly, since the portion 15b of the positive electrode 15 which protrudes from the negative electrode 18 covers approximately the entire surface of the region where the positive electrode 15 protrudes from the negative electrode 18, the electrical resistance between the positive electrode 15 and the positive voltage may be prevented from being increased which is different, for example, as compared with the case which could occur if a portion of a positive electrode which protrudes from a negative electrode is formed as a plurality of line shaped electrodes, and the positive voltage is supplied to the plurality of line shaped electrodes.

Further, in the first embodiment, as described above, the positive electrode 15 and the negative electrode 18 are sequentially stacked on the substrate 12. However, the negative electrode 18 and the positive electrode 15 may be sequentially stacked on the substrate 12. In addition, the positive electrode 15 and the negative electrode 18 may be formed of the same material or different materials.

In the first embodiment, as described above, the light emitting elements 17 are formed to be in direct contact with the positive electrode 15, and the electrode made of an island shaped metal or the like is formed between the negative electrode 18 and the light emitting elements 17, and thus, the light emitting efficiency of the light emitting elements 17 may be increased. In addition, in this case, the island shaped electrodes may be formed of a reflective film made of metal or the like, thereby omitting the reflective film 14.

Further, in the first embodiment, as described above, the insulation film 16 is disposed between the positive electrode 15 and the negative electrode 18 in a location where the positive electrode 15 overlaps with the negative electrode 18 when seen in plan view, and is arranged between the positive electrode 15 and the negative electrode 18 in a position where the side surface 15a of the positive electrode 15 is opposite to the negative electrode 18. Accordingly, the positive electrode 15 is insulated from the negative electrode 18, thereby positively preventing an electrical short.

In the first embodiment, as described above, the light shielding film 13 is formed to be in direct contact with the surface of the substrate 12, and thus, a photolithography process may be used and the light shielding film 13 may be easily patterned with a desired size, for example, unlike the case that a light shielding film is formed on the surface of the transparent electrode, thereby preventing a decrease of the aperture ratio (the region into which light transmits), which may be generated in the case that a light shielding film is formed with a size larger than the desired size. Moreover, the light shielding film 13 is formed to overlap with the light emitting elements 17 when seen in plan view. Accordingly, in the top emission type light emitting elements 17 in which light is emitted from the light emitting elements 17 toward the negative electrode 18 (in the direction opposite to the light shielding film 13), the light may be prevented from being leaked, by the light shielding film 13, in the direction (in the direction Z2 in FIG. 4) which is opposite to the direction in which the light is emitted from the light emitting elements 17.

Second Embodiment

Next, a second embodiment will be described with reference to FIG. 5. In the second embodiment, unlike the first embodiment, a display apparatus 110 which includes a bottom emission type light emitting element 53 will be described.

Figure 5:
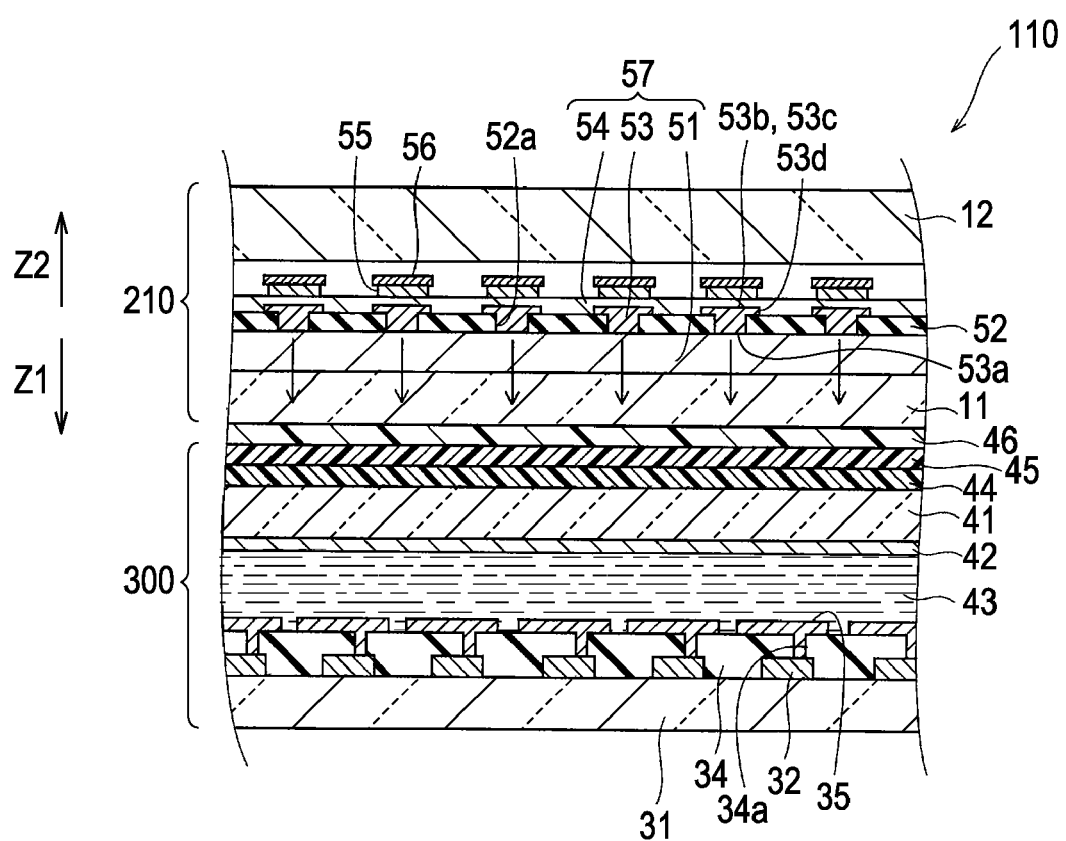
FIG. 5 is a sectional view illustrating the display apparatus according to a second embodiment.

As shown in FIG. 5, the display apparatus 110 according to the second embodiment of the present includes an illumination device 210 and a reflective liquid crystal display apparatus 300.

The illumination device 210 includes a substrate 11 which is made of a transparent member such as glass and a substrate 12 which is made of a transparent member such as glass and is disposed opposite to the substrate 11. A positive electrode 51 in the form of a transparent electrode such as ITO, IZO or SnO$_2$ and comprises a single, continuous and solid film is formed on the surface of the substrate 11 in a direction Z2. Herein, the positive electrode 51 is an example of a first transparent electrode.

In addition, an insulation film 52 which is made of a silicon dioxide film or a silicon nitride film is formed on a surface of the positive electrode 51. A plurality of contact holes 52a is formed in the insulation film 52. Light emitting elements 53 which are made of an organic layer are formed in the contact holes 52a of the insulation film 52 so as to be in direct contact with the positive electrode 51 and a negative electrode 54, described later. The contact holes 52a are an example of openings. Further, in the second embodiment, approximately an entire surface of one end 53a of each light emitting element 53 (the surface of each light emitting element 53 in a direction Z1) is formed to be in direct contact with the positive electrode 51, and approximately an entire surface of the other end 53b of each light emitting element 53 (the surface of each light emitting element 53 in the direction Z2) is formed to be in direct contact with the negative electrode 54. In addition, in the second embodiment, an upper surface 53c of each light emitting element 53 (the surface of each light emitting element 53 in the direction Z2) and a side surface 53d connected to the upper surface 53c are formed to be in direct contact with the negative electrode 54.

Further, the negative electrode 54 which is in the form of a transparent electrode such as ITO, IZO or SnO$_2$ and comprises a single, continuous and solid film without any openings is formed on a surface of the insulation film 52 in the direction Z2, and on a surface of the light emitting elements 53 in the direction Z2. Herein, the negative electrode 54 is an example of a second transparent electrode according to the second embodiment. The negative electrode 54, like the negative electrode 18 according to the first embodiment shown in FIG. 2, covers approximately an entire surface of a display region 12a and a non-display region 12b disposed in a direction X1 from the display region 12a.

In addition, in the second embodiment, a reflective film 55 which is made of metal such as aluminum (Al) is formed on a surface of the negative electrode 54 to overlap with the light emitting elements 53 when seen in plan view. A light shielding film 56 which is formed of chrome, chrome oxide, or the like is provided on a surface of the reflective film 55 in the direction Z2. The light shielding film 56 is formed to be larger than the reflective film 55 when seen in plan view. The light shielding film 56, like the light shielding film 13 according to the first embodiment shown in FIG. 2, is arranged to protrude from the reflective film 55.

Further, a positive voltage and a negative voltage are applied to the positive electrode 51 and the negative electrode 54, respectively, and thus, light is emitted from the light emitting elements 53 in the direction Z1. That is, a bottom emission type organic EL element 57 is formed by the positive electrode 51, the light emitting elements 53 and the negative element 54.

The remaining configuration of the second embodiment is the same as the first embodiment.

In the second embodiment, as described above, the reflective film 55 is formed on the surface of the negative electrode 54, and the light shielding film 56 is formed on the surface of the reflective film 55. Accordingly, in the bottom emission type light emitting elements 53 in which the light is emitted from the light emitting elements 53 toward the positive electrode 51 (in a direction opposite to the light shielding film 56), the light may be prevented from being leaked in a direction (in the direction Z2 in FIG. 5) which is opposite to a direction in which the light is emitted from the light emitting elements 53, by the light shielding film 56.

The other advantages and effects in the second embodiment are the same as the first embodiment.

It should be noted that the above described embodiments are not limitative but illustrative in various aspects. The scope of the invention is defined not by the above described embodiments but by the accompanying claims. In addition, it is possible to adopt various modifications in meaning and boundary that are equivalent to the scope of the accompanying claims.

For example, in the first embodiment and the second embodiment, examples in which light emitting elements made of an organic layer are illustrated, but the invention is not limited thereto. Alternatively, light emitting elements other than those of an organic layer may be employed.

In addition, in the first embodiment and the second embodiment, examples in which the plurality of light emitting elements is arranged in a matrix shape are illustrated, but the invention is not limited thereto.

Alternatively, the light emitting elements may be arranged in an irregular matrix shape other than a regular matrix shape.

Moreover, in the first embodiment and the second embodiment, the positive electrode is formed on the surface of the substrate and the negative electrode is formed to be opposite to the positive electrode with the insulation film interposed therebetween, but the invention is not limited thereto. Alternatively, the negative electrode may be formed on the surface of the substrate and the positive electrode may be formed to be opposite to the negative electrode with the insulation film interposed therebetween.

Further, in the first embodiment and the second embodiment, the entire surface of one end of each light emitting element and the entire surface of the other end thereof are formed to be in direct contact with the positive electrode and the negative electrode, respectively, but the invention is not limited thereto. Alternatively, the positive electrode and the negative electrode may be formed to be in direct contact with a portion of the one end of a light emitting element and a portion of the other end thereof, respectively.

Moreover, in the first embodiment and the second embodiment, examples in which the positive electrode has the portion protruding from the negative electrode when seen in plan view are illustrated, but the invention is not limited thereto. Alternatively, the positive electrode and the negative electrode may have approximately the same size and may be arranged so that the positive electrode is not protruding from the negative electrode.

In the first embodiment and the second embodiment, the reflective liquid crystal display apparatus is exemplified, but the invention is not limited thereto. Alternatively, a semi-transmissive liquid crystal display apparatus may be employed.

What is claimed is:

1. An illumination device comprising:
   a substrate having a display region;
   a first single film transparent electrode covering approximately an entire surface of the display region;
   a second single film transparent electrode which overlaps with the first transparent electrode when seen in plan view and covers approximately the entire surface of the display region; and
   a plurality of island shaped light emitting elements disposed between the first and second transparent electrodes.

2. The illumination device according to claim 1,
wherein the first transparent electrode and the second transparent electrode have approximately rectangular shapes,
wherein the first transparent electrode has a first portion protruding from one side of the second transparent electrode when seen in plan view,
wherein the second transparent electrode has a second portion protruding from the first transparent electrode at an opposite side as the one side, and
wherein one of a positive voltage and a negative voltage is supplied to the first portion of the first transparent electrode, and the other of the positive voltage and the negative voltage is supplied to the second portion of the second transparent electrode.

3. The illumination device according to claim 1, further comprising an insulation film disposed between the first transparent electrode and the second transparent electrode, and
wherein the light emitting elements are in direct contact with the first transparent electrode and the second transparent electrode via openings formed in the insulation film.

4. The illumination device according to claim 1, wherein the light emitting elements are in direct contact with one of the first transparent electrode and the second transparent electrode, and island shaped electrodes are formed between the light emitting elements and the other of the first transparent electrode and the second transparent electrode.

5. The illumination device according to claim 3, wherein the insulation film is disposed in a location where the first transparent electrode overlaps with the second transparent electrode when seen in plan view, and where a side surface of the first transparent electrode is opposite to the second transparent electrode.

6. The illumination device according to claim 1, further comprising a light shielding film and a reflective film provided to overlap with each of the light emitting elements when seen in plan view,
wherein the light shielding film is in direct contact with a surface of the substrate, and the reflective film is formed on a surface of the light shielding film which is opposite to the light emitting elements.

7. The illumination device according to claim 1, further comprising a light shielding film and a reflective film provided to overlap with each of the light emitting elements when seen in plan view,
wherein the reflective film is provided on a surface of the second transparent electrode, and the light shielding film is provided on a surface of the reflective film.

8. A display apparatus comprising the illumination device according to claim 1 which is provided on an observer side of a reflective display panel or a semi-transmissive display panel.

9. An illumination device comprising:
a substrate having a display region;
a first transparent electrode covering substantially an entire surface of the display region, the first transparent electrode being a solid film;
a second transparent electrode overlapping the first transparent electrode in plan view and covering substantially the entire surface of the display region, the second transparent electrode being a solid film; and
a plurality of island shaped light emitting elements between the first and second transparent electrodes.

10. The illumination device according to claim 9, further comprising:
an insulation film disposed between the first transparent electrode and the second transparent electrode, the insulation film including a plurality of openings passing therethrough,
wherein the light emitting elements are formed in openings of the insulation film and directly contact the first transparent electrode and the second transparent electrode.

11. An illumination device comprising:
a substrate having a display region;
a first transparent electrode substantially covering an entire surface of the display region, the first transparent electrode being a first continuous layer;
a second transparent electrode overlapping the first transparent electrode in plan view and substantially covering the entire surface of the display region, the second transparent electrode being a second continuous layer; and
a plurality of island shaped light emitting elements between the first and second transparent electrodes.

12. The illumination device according to claim 11, further comprising:
an insulation film disposed between the first transparent electrode and the second transparent electrode, the insulation film including a plurality of openings passing therethrough,
wherein the light emitting elements are formed in openings of the insulation film and directly contact the first transparent electrode and the second transparent electrode.

* * * * *